(12) United States Patent
Chung

(10) Patent No.: US 7,873,122 B2
(45) Date of Patent: Jan. 18, 2011

(54) METHODS AND DEVICES FOR WIRELESS CHIP-TO-CHIP COMMUNICATIONS

(75) Inventor: Woo Cheol Chung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 613 days.

(21) Appl. No.: 11/970,549

(22) Filed: Jan. 8, 2008

(65) Prior Publication Data
US 2009/0175323 A1 Jul. 9, 2009

(51) Int. Cl.
*H04L 27/00* (2006.01)
*H03K 9/00* (2006.01)

(52) U.S. Cl. .......................... 375/316; 174/255; 257/9; 257/324; 257/622

(58) Field of Classification Search ................. 375/316; 174/255; 257/9, 324, 622
See application file for complete search history.

(56) References Cited

U.S. PATENT DOCUMENTS

| | | | |
|---|---|---|---|
| 5,572,480 A * | 11/1996 | Ikeda et al. | 365/230.06 |
| 6,603,080 B2 | 8/2003 | Jensen | |
| 7,271,680 B2 | 9/2007 | Hall et al. | |
| 7,719,005 B2 * | 5/2010 | Ahsan et al. | 257/48 |

FOREIGN PATENT DOCUMENTS

| | | |
|---|---|---|
| EP | 1939986 | 7/2008 |
| WO | 02091616 | 11/2002 |

OTHER PUBLICATIONS

International Search Report-PCT/US2009/030445, International Search Authority-European Patent Office—Aug. 20, 2009.
Written Opinion-PCT/US2009/030445, International Search Authority-European Patent Office Aug. 20, 2009.

* cited by examiner

*Primary Examiner*—Ted M Wang
(74) *Attorney, Agent, or Firm*—Sam Talpalatsky; Nicholas J. Pauley; Jonathan T. Velasco

(57) ABSTRACT

Wireless chip-to-chip communications are methods and devices are disclosed. In an example, a wireless chip-to-chip communication device includes a plurality of chips, each of the plurality of chips having at least one antenna and formed on a multi-layered structure. The multi-layered structure includes first and second absorption layers. The first and second absorption layers are configured to enclose a propagation medium having a given dielectric constant. The plurality of chips are configured to wirelessly communicate with each other via the respective antennas in accordance with a given wireless communication protocol via a direct propagation path within the propagation medium.

25 Claims, 6 Drawing Sheets

METHODS AND DEVICES FOR WIRELESS CHIP-TO-CHIP COMMUNICATIONS

FIELD OF DISCLOSURE

The invention relates to methods and devices for wireless communications, and more particularly to methods and devices for wireless chip-to-chip communications.

BACKGROUND

FIG. 1 illustrates a conventional printed wiring board (PWB) or printed circuit board (PCB) 10 including bus wiring for linking or connecting semiconductor chips mounted thereon. Each semiconductor chip 12, 14, and 16 is coupled to PWB 10 via wire buses 18. Conductive joints between each chip and the PWB 10 are formed by permanently soldering the pins of each chip to wire buses 18. This approach of connecting chips is subject to a large number of manufacturing defects, particularly in the solder bonds, increasing the overall cost of the manufacture and decreasing the reliability of the PWB 10. While not shown explicitly within FIG. 1, the semiconductor chips 12, 14 and 16 can be mounted on a surface layer of the PWB 10, can be connected via wires to a power plane layer (i.e., for power voltage connections) and can be further connected via wires to a ground plane layer (i.e., for ground voltage connections). Each layer may be stacked or mounted on a substrate of the PWB 10.

FIG. 2 illustrates a top-view of a conventional PWB 200 for facilitating wireless communication between a plurality of semiconductor chips mounted thereon. As shown in FIG. 2, the PWB 200 includes a plurality of chips 20, 22, and 24 that are physically spaced apart on a surface layer of the PWB 200. Each chip 20, 22, and 24 includes a transmitter 30, a receiver 40 and an antenna unit 50. During operation of the PWB 200, information processed by chips 20, 22 and/or 24 is outputted by that chip's respective transmitter 30. Transmitter 30, being coupled to antenna unit 50, transmits its chip's information processed in the form of electromagnetic energy into the free space area around chips 20, 22, and 24. After a given transmitter 30 of a given chip transmits a wireless signal, a receiver 40 at one or more other chips receives, through antenna unit 50, the transmitted information. The information received by receiver 40 is then transferred into the chip for further processing.

In order to accomplish the above-described wireless transmission and reception of FIG. 2, each transmitter 30 and receiver 40 ("transceiver 30/40") operates in accordance with a given wireless communication protocol (alternatively referred to as wireless communication signaling), such as an amplitude modulation ("AM") scheme operating at different carrier frequencies. Under the AM scheme, each distinct carrier frequency can be within the operative radio frequency spectra. The wireless communication protocol used by the transceiver 30/40 may alternatively employ frequency modulation, phase shift key modulation, frequency shift key modulation, or multiphase frequency shift key modulation. The wireless communication protocol used by the transceiver 30/40 may alternatively include time division multiplexing and/or a coding scheme (e.g., Walsh codes).

As will be appreciated by one of ordinary skill in the art, the wireless transmissions at each antenna 50 of each chip can increase interference at both (i) other chips of the PWB 200 and (ii) electronic devices in proximity to the PWB 200.

Conventionally, the entire PWB 200 can be shielded with a metal housing (not shown) in order to reduce type (ii) interference. The metal housing reduces stray electromagnetic radiation as well as unintended coupling of energy generated by other systems (not shown) from interfering with operation of the PWB 200. However, type (i) interference can remain problematic in conventional wireless chip-to-chip communication systems.

SUMMARY

An exemplary embodiment of the present invention is directed to a wireless chip-to-chip communication device, including a plurality of chips, each of the plurality of chips having at least one antenna and formed on a multi-layered structure and first and second absorption layers included within the multi-layered structure, the first and second absorption layers forming a propagation medium having a given dielectric constant, wherein the plurality of chips are configured to wirelessly communicate with each other via the respective antennas in accordance with a given wireless communication protocol through a direct propagation path within the propagation medium.

Another exemplary embodiment of the present invention is directed to a method of wireless chip-to-chip communication, including receiving, at a first antenna coupled to a first chip from a second antenna coupled to a second chip, wireless communication signals in accordance with a given wireless communication protocol, the first and second chips formed on a multi-layered structure, the wireless communication signals transmitted via a direct propagation path within a propagation medium having a given dielectric constant formed by first and second absorption layers of the multi-layered structure.

Another exemplary embodiment of the present invention is directed to a method of wireless chip-to-chip communication, including transmitting, to a first antenna coupled to a first chip from a second antenna coupled to a second chip, wireless communication signals in accordance with a given wireless communication protocol, the first and second chips formed on a multi-layered structure, the wireless communication signals transmitted via a direct propagation path within a propagation medium having a given dielectric constant formed by first and second absorption layers of the multi-layered structure.

Another exemplary embodiment of the present invention is directed to a wireless chip-to-chip communication device, including means for wirelessly transmitting electromagnetic signals within a multi-layered structure, means for wirelessly receiving the electromagnetic signals within the multi-layered structure, means for absorbing the electromagnetic signals propagated within the multi-layered structure, and means for propagating the electromagnetic signals having a given dielectric constant and being enclosed by the means for absorbing, and wherein the means for wirelessly transmitting and receiving communicate with each other in accordance with a given wireless communication protocol through a direct propagation path within the means for propagating.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1:
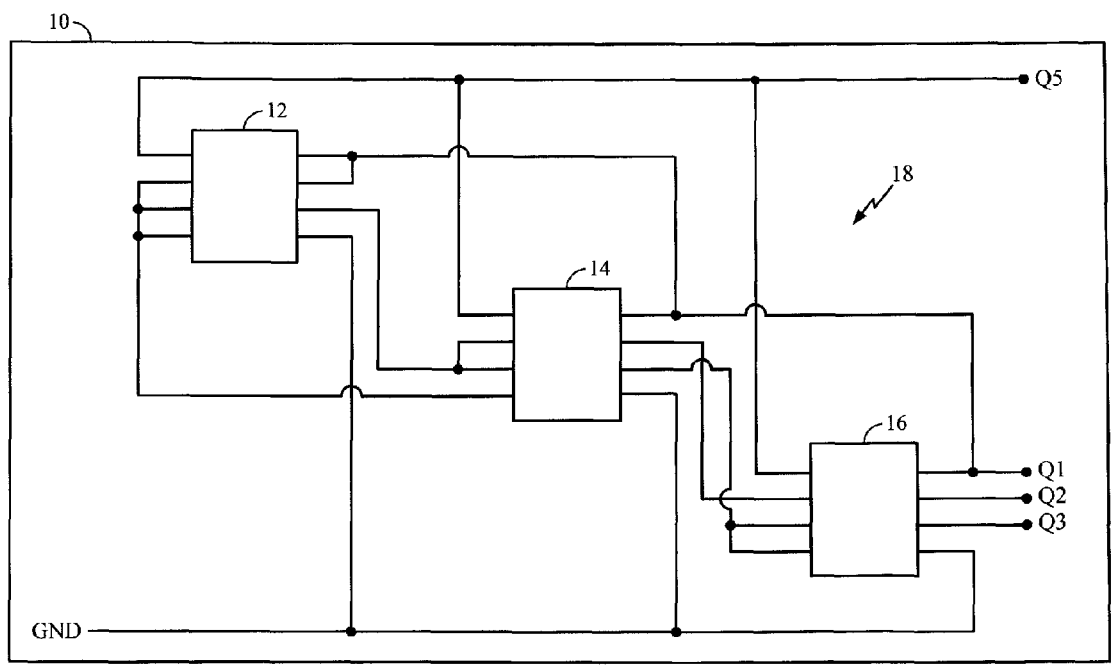
FIG. 1 illustrates a conventional printed wiring board (PWB) including bus wiring for linking or connecting semiconductor chips mounted thereon.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

As discussed in the Background section, wireless communication implemented between respective chips (e.g., integrated circuits, semiconductor devices and the like) on a conventional printed wiring board (PWB) is performed by positioning a transceiver and antenna on top of each chip, transmitting wireless signals between the chips via the antennas and enclosing the entire system by a metal casing to reduce external interference to the PWB, and to reduce interference from the chip transmissions to external systems. As will now be described in greater detail, embodiments of the present invention are directed to enclosing a propagation medium within absorption layers within internal layers of the PWB such that a metal casing need not be included to protect against interference.

Figure 3:
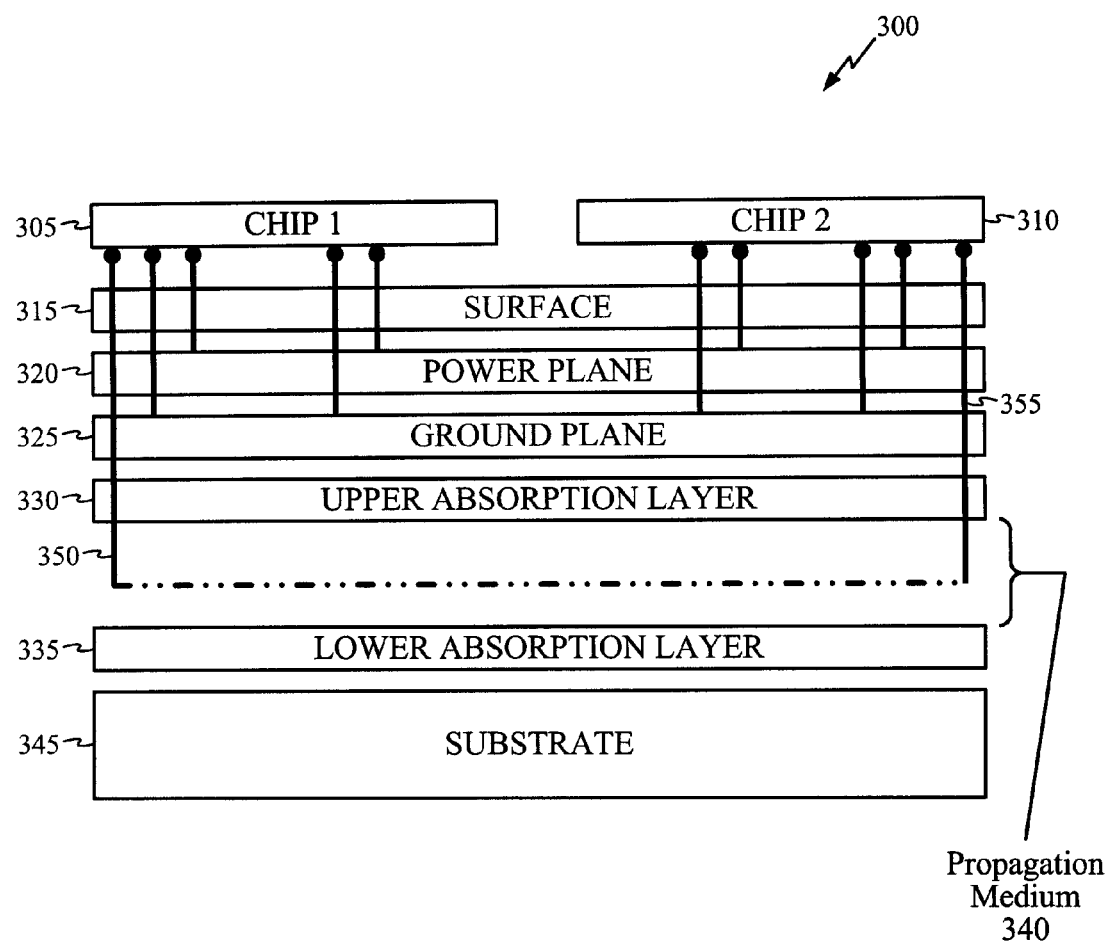
FIG. 3 illustrates a cross-section of a PWB.

FIG. 3 illustrates a cross-section of a printed wiring board (PWB) 300 according to an embodiment of the present invention. As shown in FIG. 3, the PWB 300 includes semiconductor chips 305 and 310 each mounted on a surface layer 315, a power plane layer 320, a ground plane 325, an upper absorption layer 330 and a lower absorption layer 335 collectively defining a propagation medium 340, and a substrate 345. The semiconductor chips 305 and 310 are each connected to the power plane layer 320 and the ground plane layer 325 with one or more wired connections, as is known in the art. Generally, the semiconductor chips 305 and 310 connect to the power plane layer 320 to acquire a power voltage Vdd, and connect to the ground plane layer to acquire a ground voltage Vgnd. The surface layer 315 can correspond to any type of surface, and the mounting of the semiconductor chips 305 and 310 to the surface layer 315 can be performed using any well-known methodologies, such as with adhesives, screws, etc.

Referring to FIG. 3, a first antenna 350 extends inward, relative to the PWB 300, from the semiconductor chip 305 and protrudes at least partially into the propagation medium 340, and a second antenna 355 extends inward, relative to the PWB 300, from the semiconductor chip 310 and protrudes at least partially into the propagation medium 340. In an example, the first and second antennas 350 and 355 may be shielded, at least within portions of the antennas other than within the propagation medium 340, to reduce interference outside of the propagation medium 340 (e.g., such that wireless signals are substantially contained within the propagation medium 340). Likewise, the upper and lower absorption layers 330 and 335 are configured with a material that contains signals propagating within the propagation medium 340. For example, the upper and lower absorption layers 330 and 335 could be implemented with Ni—Zn ferrite material. Thus, in an example, wireless communication signals or radio frequency (RF) signals that contact the upper or lower absorption layers 330 and 335 are "absorbed", and do not pass through the respective layers to external regions or reflect/bounce off the respective layers (e.g., which could otherwise cause multi-path issues at receiving antennas).

As discussed above, the upper and lower absorption layers 330 and 335 collectively define the propagation medium 340. The propagation medium 340 can include any well-known material. For example, the propagation medium 340 can be air. The propagation medium 340 determines the propagation speed of wireless communication signals transmitted therein. In other words, the material filling the region between the upper and lower absorption layers 330 and 335 (i.e., the propagation medium 340) determines the propagation speed of wireless communication signals transferred between the first and second antennas 350 and 355 based on an associated dielectric constant of the material. For example, the propagation speed through a dielectric medium can be expressed as follows:

$$v = \frac{c}{\sqrt{\varepsilon_R}} \qquad \text{Equation 1}$$

wherein v denotes the propagation velocity of wireless communication signals, or radio frequency (RF) signals, within the propagation medium 340, c denotes the speed of light in a vacuum and $\varepsilon_R$ denotes the relative dielectric constant of the propagation medium 340. For example, if Teflon ($\varepsilon_R$=2.1) is used for the propagation medium 340, the speed of electromagnetic waves propagating in this medium 340, v, would be about 69% of the speed of light in a vacuum.

As will be appreciated by one of ordinary skill in the art, the propagation velocity v as defined by Equation 1 is a point-to-point propagation velocity, and does not necessarily convey how fast signals travel from one antenna to another antenna in the case of multi-path signals, or signals which do not take a straight or direct propagation path from the source antenna to the destination antenna. However, because the upper and lower absorption layers 330 and 335 are configured to "absorb" RF signals, and not to reflect/bounce signals within the propagation medium 340, multi-path signals can generally be disregarded between antennas 350 and 355, such that a direct propagation path is formed and the propagation velocity v as defined by Equation 1 above can serve as a relatively accurate indicator for signal propagation speeds between antennas 350 and 355 within the propagation medium 340.

Figure 2:
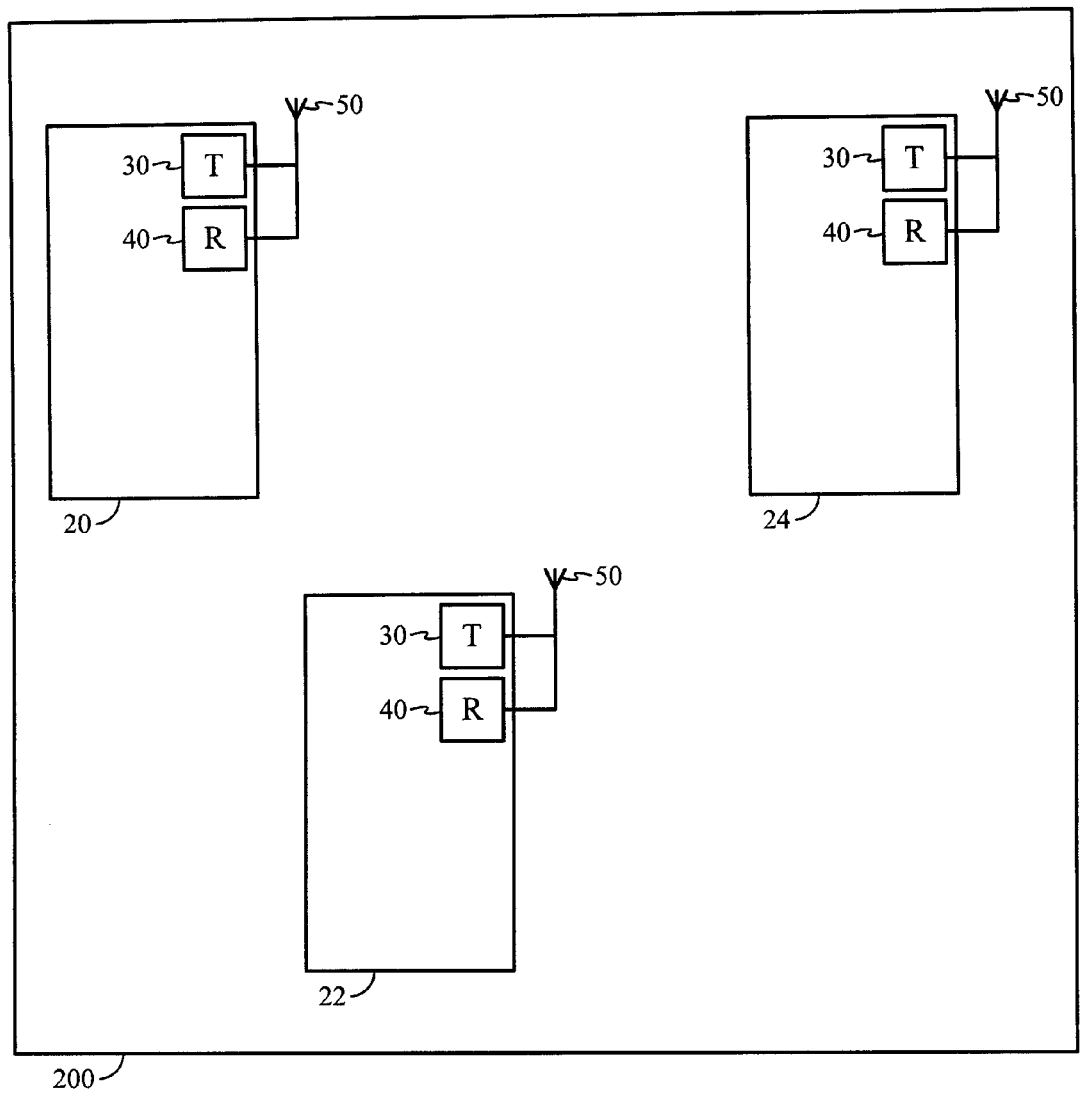
FIG. 2 illustrates a top-view of a conventional PWB for facilitating wireless communication between a plurality of semiconductor chips mounted thereon.

While not illustrated explicitly within FIG. 3, antennas 350 and 355 can be connected to a receiver and transmitter pair, or transceiver, within semiconductor chips 305 and 310, respectively. In contrast to FIG. 2, the transceiver need not be positioned "on top" of the chips 305 and 310, but rather can be positioned on a lower portion thereof, or within the chips 305 and 310.

Further, while the antennas 350 and 355 are illustrated within FIG. 3 as protruding approximately halfway into the space defined for the propagation medium 340, it will be appreciated that in other embodiments the antennas 350 and 355 may protrude into the propagation medium 340 at different degrees (e.g., less than halfway in, more than halfway in, etc.). Also, while the antenna protrusions are illustrated as being "straight" into the propagation medium 340, the antenna protrusions may alternatively be configured in any well known manner. For example, upon entry into the propagation medium 340, the antennas can be "bent" or curved so as to be positioned, for a given length, along a lower portion of the upper absorption layer 340 (i.e., an upper portion of the propagation medium 340). It will be appreciated that the above-described antenna configurations are provided for example purposes only, and any manner of antenna configuration is intended to be included within the scope of embodiments of the present invention.

Figure 4:
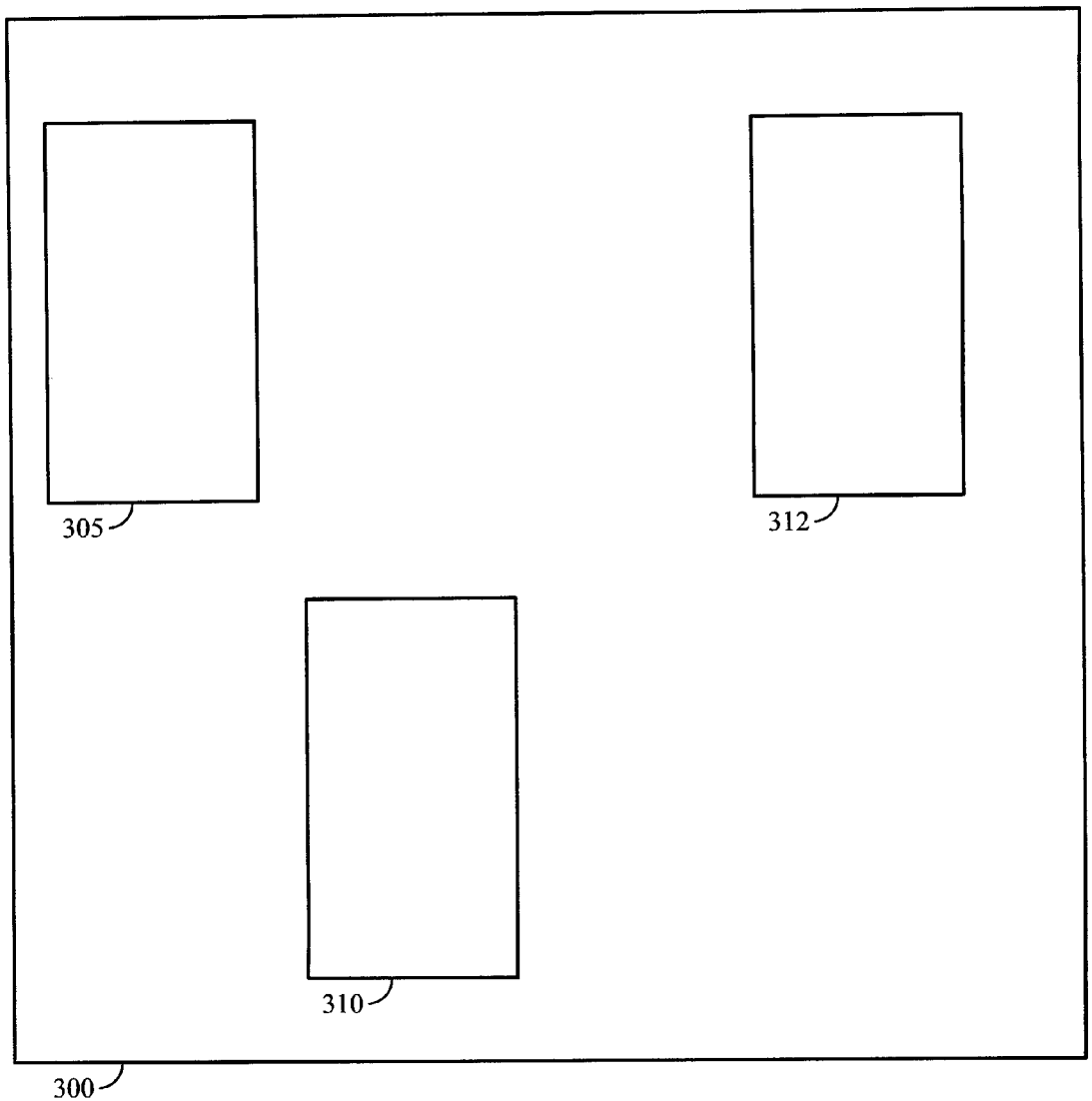
FIG. 4 illustrates a top-view of the PWB of FIG. 3.

FIG. 4 illustrates a top-view of the PWB 300 of FIG. 3. As shown in FIG. 4, the PWB 300 includes the chips 305 and 310, and can further include a chip 312. Each of chips 305, 310 and 312 include an antenna on a lower portion thereof that protrudes at least partially into the propagation medium 340 between the upper and lower absorption layers 330 and 335.

Each chip among chips 305, 310 and 312 may communicate with any other chip by transmitting wireless communication signals in accordance with a given wireless communication protocol via the propagation medium 340. For example, the given wireless communication protocol (or signaling) may include, but is not limited to, amplitude modulation (AM), frequency modulation (FM), code-division multiple access (CDMA), ultra-wideband (UWB), direct-sequence UWB (DS-UWB), frequency division multiple access (FDMA), time division multiple access (TDMA), orthogonal frequency division multiple access (OFDMA), a hybrid CDMA/OFDMA protocol, multi-band OFDM-based Ultra-Wideband (MB-OFDM-UWB), etc. In order to implement the given wireless communication protocol, a given chip among chips 305, 310 and 312 can be designated as a "master", or scheduler, for the PWB 300. Thus, the scheduler can determine and disseminate a given polling schedule, or transmission schedule, for the different chips within PWB 300 (e.g., similar to a base station controller (BSC) within a conventional wireless cellular communication system). Alternatively, the scheduler can determine and disseminate Walsh codes to each respective chip, with each chip transmitting wireless signals with its assigned Walsh code, as in CDMA cellular communication systems.

While FIGS. 3 and 4 have been illustrated and above-described wherein chips are positioned apart from each other within the PWB 300, in an alternative embodiment, two or more chips may be arranged in a "stacked" structure within the PWB. Accordingly, FIG. 5 illustrates a cross section of a PWB 500 according to another embodiment of the present invention.

Figure 5:
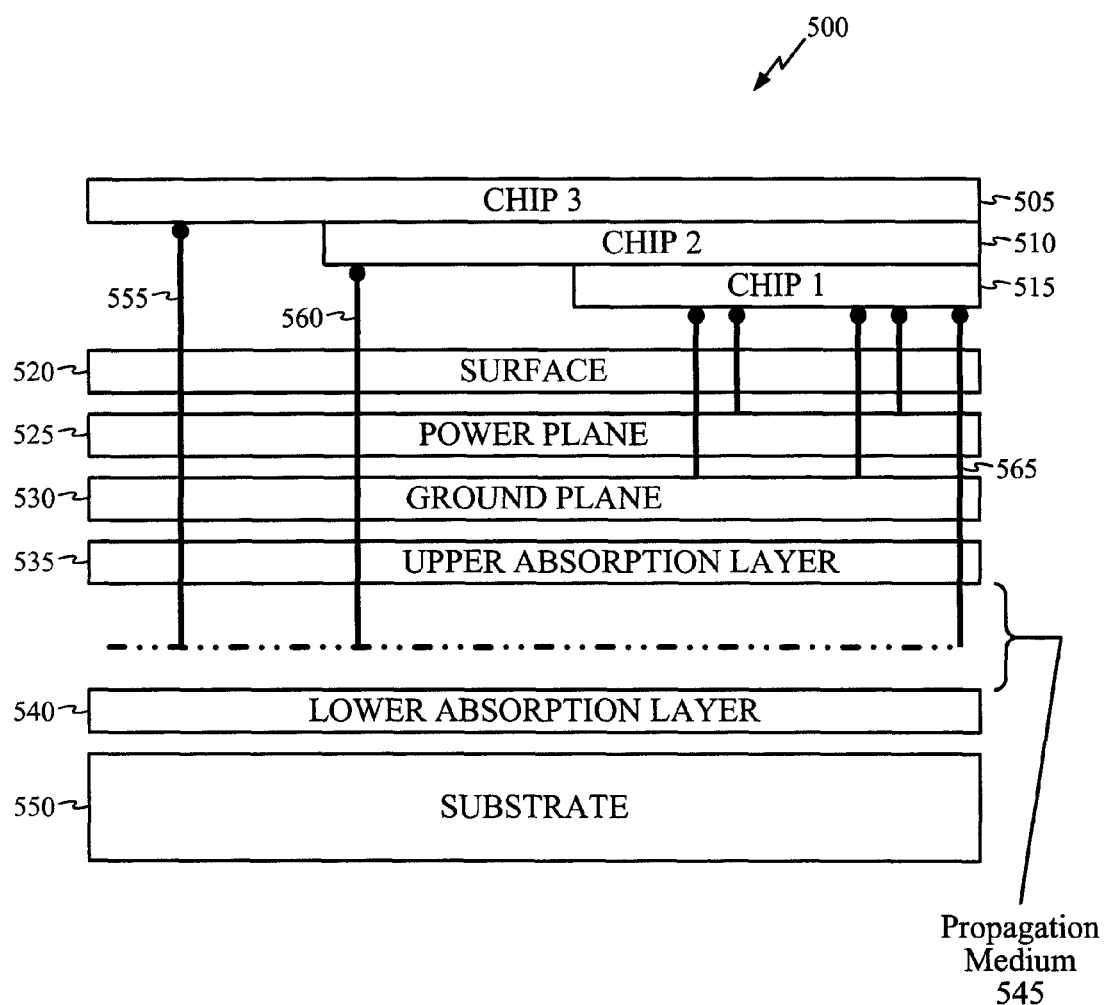
FIG. 5 illustrates a cross-section PWB according to another configuration.

As shown in FIG. 5, the PWB 500 includes semiconductor chips 505, 510 and 515 in a "stacked" configuration, with chip 505 mounted on chip 510, chip 510 mounted on chip 515, and the entirety of the stacked chip structure mounted on a surface layer 520. The PWB 500 further includes a power plane layer 525, a ground plane 530, an upper absorption layer 535 and a lower absorption layer 540 collectively defining a propagation medium 545, and a substrate 540. The semiconductor chips 505, 510 and 515 are physically stacked, and share wired connections to the power plane layer 525 and the ground plane layer 530, as is known in the art.

Referring to FIG. 5, a first antenna 555 extends inward, relative to the PWB 500, from the semiconductor chip 505 and protrudes at least partially into the propagation medium 545, a second antenna 560 extends inward, relative to the PWB 500, from the semiconductor chip 510 and protrudes at least partially into the propagation medium 545, and a third antenna 565 extends inward, relative to the PWB 500, from the semiconductor chip 515 and is projected into the propagation medium 545. In an example, the first, second and third antennas 555, 560 and 565 may be shielded, at least within portions of the antennas other than within the propagation medium 545, to reduce interference outside of the propagation medium 545 (e.g., such that wireless signals are contained within the propagation medium 545). Likewise, the upper and lower absorption layers 535 and 540 are configured with a material that contains signals propagating within the propagation medium 545. For example, the upper and lower absorption layers 535 and 540 could be implemented with Ni—Zn ferrite material. Thus, in an example, wireless communication signals that contact the upper or lower absorption layers 535 and 540 are "absorbed", and do not pass through the respective layers to external regions or reflect/bounce off the respective layers (e.g., which could otherwise cause multi-path issues at receiving antennas). Generally, the propagation medium 545 corresponds to the propagation medium 340 discussed above with respect to FIG. 3, and will not be described further for the sake of brevity.

Further, while the antennas 555, 560 and 565 are illustrated within FIG. 5 as protruding approximately halfway into the space defined for the propagation medium 545, it will be appreciated that in other embodiments the antennas 555, 560 and 565 may protrude into the propagation medium 545 at different degrees (e.g., less than halfway in, more than halfway in, etc.). Also, while the antenna protrusions are illustrated as being "straight" into the propagation medium 545, the antenna protrusions may alternatively be configured in any well known manner. For example, upon entry into the propagation medium 545, the antennas can be "bent" or curved so as to be positioned, for a given length, along a lower portion of the upper absorption layer 535. It will be appreciated that the above-described antenna configurations are provided for example purposes only, and any manner of antenna configuration is intended to be included within the scope of embodiments of the present invention.

Figure 6:
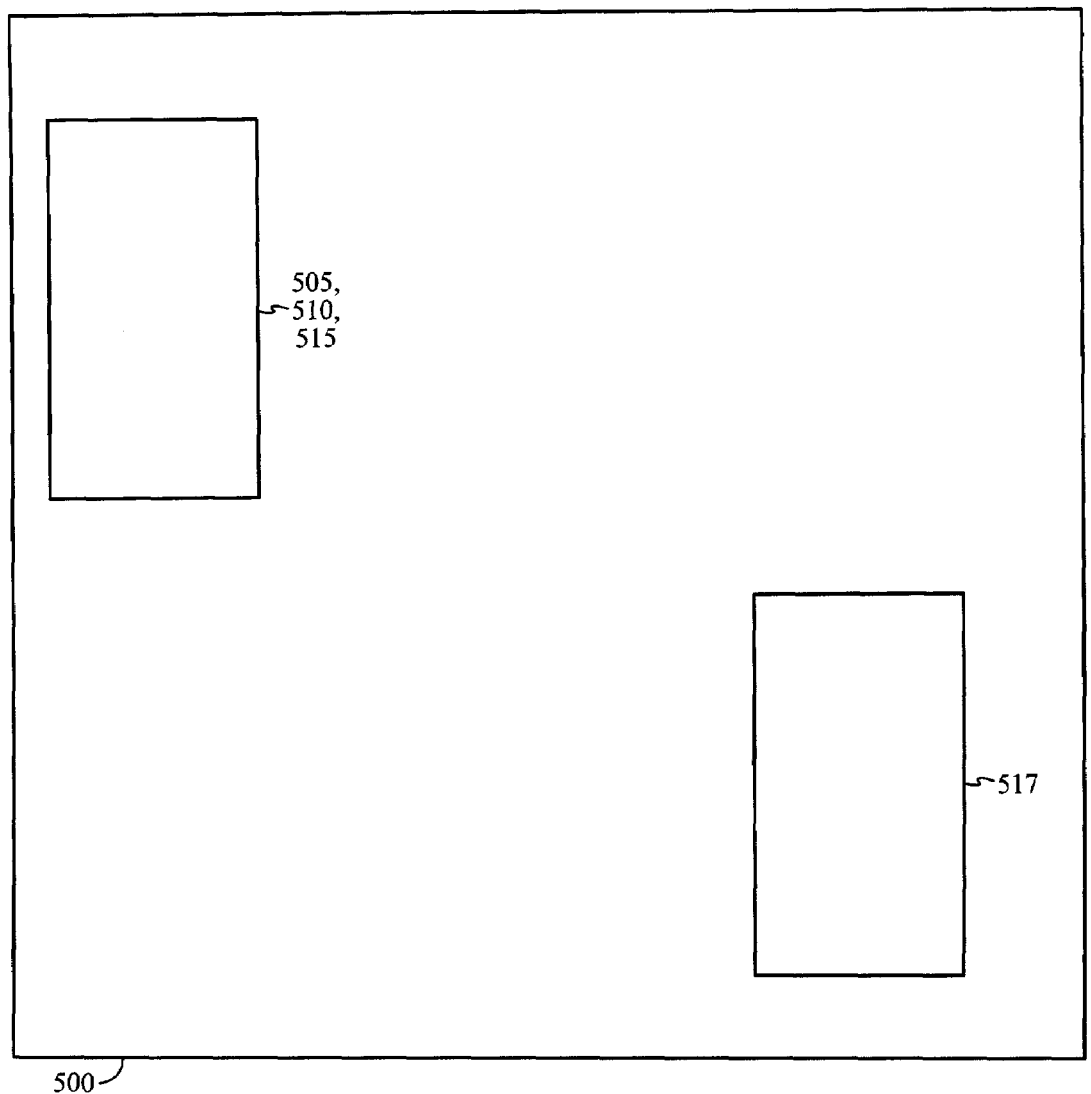
FIG. 6 illustrates a top-view of the PWB of FIG. 5.

FIG. 6 illustrates a top-view of the PWB 500 of FIG. 5. As shown in FIG. 6, the PWB 500 includes a chip stack including chips 505, 510 and 515, and further includes a single (i.e., non-stacked) chip 517. Each of chips 505, 510 and 515 include an antenna on a lower portion thereof that protrudes at least partially into the propagation medium 545 between the upper and lower absorption layers 535 and 540, as illustrated in FIG. 5. Also, the chip 517, which is not necessarily a stacked chip, includes an antenna protruding at least partially into the propagation medium 545.

As will be appreciated, any of chips 505, 510, 515 and 517 may be designated as a "master" or scheduler for facilitating wireless communication between different chips. The wireless communication between chips 505, 510, 515 and 517 may be performed in the same manner as described above with respect to FIGS. 3 and 4, and as such will not be described further for the sake of brevity.

While embodiments of the present invention are above-described as facilitating wireless chip-to-chip communications between chips on a PWB, it will be appreciated that other embodiments of the present invention may be directed to any type of "interior" wireless inter-chip communication on any type of multi-layered structure, and not necessarily on a PWB. For example, other embodiments can be directed to wireless communication between chips via any enclosed propagation medium (e.g., on a PWB or any other type of device), and as such embodiments are not limited to propagation media formed within absorption layers of a PWB.

As will be appreciated from the above-description of embodiments of the present invention, by configuring chips to communicate wirelessly within a trench or isolation region (i.e., propagation medium 340/545), the number of pins or solder balls associated with wired connections of conventional chips/integrated circuits (IC) can be reduced. Also, an input/output (I/O) efficiency of the PWB can be increased. Further, the simplified structure of the PWB can decrease fabrication costs and complexity (e.g., because the wired connections between chips need not be designed and/or manufactured).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying code causing a processor to perform a method for receiving, at a first antenna coupled to a first chip from a second antenna coupled to a second chip, wireless communication signals in accordance with a given wireless communication protocol, the first and second chips formed on a multi-layered structure, the wireless communication signals transmitted via a direct propagation path within a propagation medium having a given dielectric constant formed by first and second absorption layers of the multi-layered structure. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A wireless chip-to-chip communication device, comprising:
    a plurality of chips, each of the plurality of chips having at least one antenna and formed on a multi-layered structure; and
    first and second absorption layers included within the multi-layered structure, the first and second absorption layers forming a propagation medium having a given dielectric constant, wherein the plurality of chips are configured to wirelessly communicate with each other via the respective antennas in accordance with a given wireless communication protocol through a direct propagation path within the propagation medium.

2. The communication device of claim 1, wherein the multi-layered structure is a printed wiring board (PWB).

3. The communication device of claim 1, wherein a given chip among the plurality of chips schedules communications among the plurality of chips.

4. The communication device of claim 1, wherein the propagation medium includes air.

5. The communication device of claim 1, wherein the propagation medium corresponds to a region between the first and second absorption layers.

6. The communication device of claim 1, wherein the at least one antenna for each chip protrudes at least partially into the propagation medium.

7. The communication device of claim 6, wherein the at least one antenna for each chip is shielded in a portions of the at least one antenna other than the protruding portion.

8. The communication device of claim 1, wherein two or more of the plurality of chips are arranged in a stacked configuration.

9. The communication device of claim 1, wherein the first and second absorption layers are formed from Ni—Zn ferrite material.

10. The communication device of claim 1, wherein the given wireless communication protocol corresponds to one of amplitude modulation (AM), frequency modulation (FM), code-division multiple access (CDMA), ultra-wideband (UWB), direct-sequence UWB (DS-UWB), frequency division multiple access (FDMA), time division multiple access (TDMA), orthogonal frequency division multiple access (OFDMA), a hybrid CDMA/OFDMA protocol, or multi-band OFDM-based Ultra-Wideband (MB-OFDM-UWB).

11. The communication device of claim 1, wherein the multi-layered structure includes a surface layer, a power plane layer, a ground plane layer, the first and second absorption layers and a substrate.

12. The communication device of claim 11, wherein at least one of the plurality of chips is mounted on the surface layer, includes a wired connection to the power plane layer and includes a wired connection to the ground plane layer.

13. A method of wireless chip-to-chip communication, comprising:
receiving, at a first antenna coupled to a first chip from a second antenna coupled to a second chip, wireless communication signals in accordance with a given wireless communication protocol, the first and second chips formed on a multi-layered structure, and the wireless communication signals being transmitted via a direct propagation path within a propagation medium having a given dielectric constant formed by first and second absorption layers of the multi-layered structure.

14. The method of claim 13, wherein the multi-layered structure is a printed wiring board (PWB).

15. The method of claim 13, wherein the propagation medium includes air.

16. The method of claim 13, wherein the first and second antennas for each chip protrudes at least partially into the propagation medium.

17. The method of claim 13, wherein the first and second chips are stacked.

18. The method of claim 13, wherein the given wireless communication protocol corresponds to one of amplitude modulation (AM), frequency modulation (FM), code-division multiple access (CDMA), ultra-wideband (UWB), direct-sequence UWB (DS-UWB), frequency division multiple access (FDMA), time division multiple access (TDMA), orthogonal frequency division multiple access (OFDMA), a hybrid CDMA/OFDMA protocol, or multi-band OFDM-based Ultra-Wideband (MB-OFDM-UWB).

19. A method of wireless chip-to-chip communication, comprising:
transmitting, to a first antenna coupled to a first chip from a second antenna coupled to a second chip, wireless communication signals in accordance with a given wireless communication protocol, the first and second chips formed on a multi-layered structure, the wireless communication signals transmitted via a direct propagation path within a propagation medium having a given dielectric constant formed by first and second absorption layers of the multi-layered structure.

20. The method of claim 19, wherein the multi-layered structure is a printed wiring board (PWB).

21. The method of claim 19, wherein the propagation medium includes air.

22. The method of claim 19, wherein the first and second antennas for each chip protrudes at least partially into the propagation medium.

23. The method of claim 19, wherein the first and second chips are stacked.

24. The method of claim 19, wherein the wireless communication protocol corresponds to one of amplitude modulation (AM), frequency modulation (FM), code-division multiple access (CDMA), ultra-wideband (UWB), direct-sequence UWB (DS-UWB), frequency division multiple access (FDMA), time division multiple access (TDMA), orthogonal frequency division multiple access (OFDMA), a hybrid CDMA/OFDMA protocol, or multi-band OFDM-based Ultra-Wideband (MB-OFDM-UWB).

25. An apparatus configured for wireless chip-to-chip communication comprising:
means for wirelessly transmitting electromagnetic signals within a multi-layered structure;
means for wirelessly receiving the electromagnetic signals within a the multi-layered structure;
means for absorbing the electromagnetic signals propagated within the multi-layered structure; and
means for propagating the electromagnetic signals having a given dielectric constant and being enclosed by the means for absorbing, and wherein the means for wirelessly transmitting and receiving communicate with each other in accordance with a given wireless communication protocol through a direct propagation path within the means for propagating.

* * * * *

UNITED STATES PATENT AND TRADEMARK OFFICE
CERTIFICATE OF CORRECTION

| | | |
|---|---|---|
| PATENT NO. | : 7,873,122 B2 | Page 1 of 1 |
| APPLICATION NO. | : 11/970549 | |
| DATED | : January 18, 2011 | |
| INVENTOR(S) | : Chung | |

It is certified that error appears in the above-identified patent and that said Letters Patent is hereby corrected as shown below:

Column 8, line 63, claim 7: "a portions" to read as --a portion--

Column 10, line 38, claim 25: "a the multi-layered" to read as --the multi-layered--

Signed and Sealed this
Thirtieth Day of August, 2011

David J. Kappos
*Director of the United States Patent and Trademark Office*